US010732216B2

United States Patent
Chen et al.

(10) Patent No.: US 10,732,216 B2
(45) Date of Patent: Aug. 4, 2020

(54) METHOD AND DEVICE OF REMAINING LIFE PREDICTION FOR ELECTROMIGRATION FAILURE

(71) Applicant: Fifth Electronics Research Institute of Ministry of Industry and Information Technology, Guangdong (CN)

(72) Inventors: Yiqiang Chen, Guangdong (CN); Yunfei En, Guangdong (CN); Xiaowen Zhang, Guangdong (CN); Yun Huang, Guangdong (CN); Yudong Lu, Guangdong (CN)

(73) Assignee: FIFTH ELECTRONICS RESEARCH INSTITUTE OF MINISTRY OF INDUSTRY AND INFORMATION TECHNOLOGY, Guangdong (CN)

( * ) Notice: Subject to any disclaimer, the term of this patent is extended or adjusted under 35 U.S.C. 154(b) by 85 days.

(21) Appl. No.: 15/910,766

(22) Filed: Mar. 2, 2018

(65) Prior Publication Data
US 2018/0188316 A1 Jul. 5, 2018

Related U.S. Application Data

(63) Continuation-in-part of application No. 14/348,844, filed as application No. PCT/CN2013/076987 on Jun. 8, 2013, now Pat. No. 9,952,275.

(30) Foreign Application Priority Data

Oct. 30, 2012 (CN) .......................... 2012 1 0424774

(51) Int. Cl.
*G01R 31/26* (2020.01)
*G01R 31/28* (2006.01)

(52) U.S. Cl.
CPC ..... *G01R 31/2642* (2013.01); *G01R 31/2601* (2013.01); *G01R 31/2639* (2013.01); *G01R 31/2858* (2013.01)

(58) Field of Classification Search
CPC ............ G01R 31/2642; G01R 31/2601; G01R 31/2858; G01R 31/2639
See application file for complete search history.

(56) References Cited

U.S. PATENT DOCUMENTS

| | | | |
|---|---|---|---|
| 6,350,626 B1 | 2/2002 | Cheng et al. | |
| 2006/0125494 A1* | 6/2006 | Von Hagen | G01R 31/2648 324/722 |

(Continued)

FOREIGN PATENT DOCUMENTS

| | | |
|---|---|---|
| CN | 1568430 A | 1/2005 |
| CN | 1988124 A | 6/2007 |

(Continued)

OTHER PUBLICATIONS

Search Report for related Chinese Application No. 201210424774.8; report dated Jan. 5, 2015.

(Continued)

*Primary Examiner* — Stephanie E Bloss
(74) *Attorney, Agent, or Firm* — Miller, Matthias & Hull LLP

(57) ABSTRACT

A method for predicting remaining life of electromigration failure is disclosed. The methods includes: establishing an electromigration life model of a MOS device; acquiring a normal electromigration failure lifetime $\tau_1$, based on a current density and a first environment temperature under a preset normal operating condition and the electromigration life model; acquiring a current density stress, based on a target prognostic point $\tau_2$, a second environment temperature and the electromigration life model; inputting the current density stress into a MOS device electromigration (Continued)

failure warning circuit based on a prognostic cell; and if the prognostic circuit of EM failure for a MOS device outputs a high level after a time $\tau_3$, acquiring a remaining life of electromigration failure corresponding to $\tau_2'$ based on $\tau_1$, $\tau_2$ and $\tau_3$. A device for remaining life prediction for electromigration failure is also disclosed.

4 Claims, 3 Drawing Sheets

(56) References Cited

U.S. PATENT DOCUMENTS

| | | | |
|---|---|---|---|
| 2008/0098270 A1 | 4/2008 | De Ceuninck | |
| 2010/0127719 A1 | 5/2010 | Federspiel | |
| 2011/0285401 A1* | 11/2011 | Arnaud | G01R 31/2858 |
| | | | 324/538 |
| 2014/0109030 A1* | 4/2014 | Lee | G06F 30/367 |
| | | | 716/115 |

FOREIGN PATENT DOCUMENTS

| | | |
|---|---|---|
| CN | 101923124 A | 12/2010 |
| CN | 102590629 A | 7/2012 |
| CN | 102955121 A | 3/2013 |

OTHER PUBLICATIONS

International Search Report for related International Application No. PCT/CN2013/076987; report dated Oct. 30, 2012.

* cited by examiner

METHOD AND DEVICE OF REMAINING LIFE PREDICTION FOR ELECTROMIGRATION FAILURE

CROSS-REFERENCE TO RELATED APPLICATIONS

This application is a continuation of U.S. patent application Ser. No. 14/348,844, filed on Mar. 31, 2014, which is a 35 USC § 371 U.S. national stage filing of International Patent Application No. PCT/CN2013/076987 filed on Jun. 8, 2013, and claiming priority under the Paris Convention to Chinese Patent Application No. CN 201210424774.8 filed on Oct. 30, 2012, all of which are incorporated herein by reference for all that they teach and disclose without exclusion of any portion thereof.

TECHNICAL FIELD

The present disclosure relates to the field of life prediction for MOS device, and more particularly, to a method and device for remaining life prediction for electromigration (EM) failure.

BACKGROUND

With the rapid development of modern electronic technology, the feature sizes of Metal Oxide Semiconductor (MOS) devices decrease to nanometer, and the area percent of metal interconnects becomes larger and larger in the whole IC chip. The problem of EM failure in metal interconnect has become bottleneck for the development of large-scale integrated circuit (IC). The EM is the transport of material caused by the movement of electrons acting on metal atoms in the metal interconnect, which is shown as cavity or hillock, which causes resistance value increase linearly resulting in failure, and which seriously influences the life of IC. The factors that affect EM in metal interconnect are very complicated, including work current crowding, joule heat, temperature gradient, crystal structure, crystal orientation, interface microstructure, stress gradient, alloy composition, size and shape of interconnect, etc. Especially, under the action of higher current densities, metal atoms in the metal interconnect are more likely to cause EM along the direction of electron motion.

At present, there mainly exist two approaches to achieve the prediction and protection for reliability of MOS device: one is carrying out reliability life test for MOS device and predicting the reliability life of the device, and the other is performing failure analysis for a MOS device, determining its failure mode and failure mechanism, and proposing improvement measures based on this.

However, for the first of the above approaches, the reliability life of a MOS device is calculated by the reliability life test data based on simple stress condition, and actual working state and working environment are not involved in the reliability life test, while in practical use, the MOS device is in a complicated working environment under the comprehensive effects of various stress, so a traditional life prediction is quite different to reality, with poor reliability. In addition, such reliability prediction for MOS device costs a lot of money and time and needs to be tested regularly.

For the second of the above approaches, failure analysis of a failure device is a post diagnosis technology, which is not a best approach from both economy and technology standpoints for a device with very clear failure mode and failure mechanism.

SUMMARY

In view of the above, the object of the present disclosure is to provide a method and device for remaining life prediction for EM failure, which can improves the reliability of predicting the remaining life of a MOS device from EM failure, improves predictive efficiency and reduces cost.

According to one aspect of the disclosure, a method for predicting remaining life of EM failure includes the following steps:

establishing an EM life model of a MOS device;

acquiring a normal EM failure lifetime τ1, based on a current density and a first environment temperature under a preset normal operating condition and the EM life model;

acquiring a current density stress, based on a target prognostic point τ2, a second environment temperature and the EM life model;

inputting the current density stress into a prognostic circuit of EM failure for a MOS device; and if the prognostic circuit of EM failure for a MOS device outputs a high level after a time τ3, acquiring a remaining life of EM failure corresponding to τ2' based on τ1, τ2 and τ3.

According to an additional aspect of the disclosure, a device for remaining lifetime prediction for EM failure includes:

a model establishing unit, configured to establish an EM life model of a MOS device;

a first acquisition unit, configured to acquire a normal EM failure lifetime τ1, based on a current density and a first environment temperature under a preset normal operating condition and the EM life model;

a second acquisition unit, configured to acquire a current density stress, based on a target prognostic point $\tau_2$, a second environment temperature and the EM life model;

a current input unit, configured to input the current density stress into a prognostic circuit of EM failure for a MOS device; and a third acquisition unit, configured to if the prognostic circuit of EM failure for a MOS device outputs a high level after a time $\tau_3$, acquire a remaining life of EM failure corresponding to $\tau_2$' based on $\tau_1$, $\tau_2$ and $\tau_3$.

The present disclosure starts with the current active state of the MOS device to predicate the EM failure in the MOS device that may appear in the future combined with the actual working state and working environment of the device, especially before the failure, evaluates the remaining life of the device in order to replace the MOS device near failure before the occurrence of fault, to ensure reliability. The present disclosure needs no periodic test to learn the remaining life before EM failure, which can reduce the cost caused by periodic tests and improve testing efficiency.

DETAILED DESCRIPTION OF THE PREFERRED EMBODIMENTS

Figure 1:
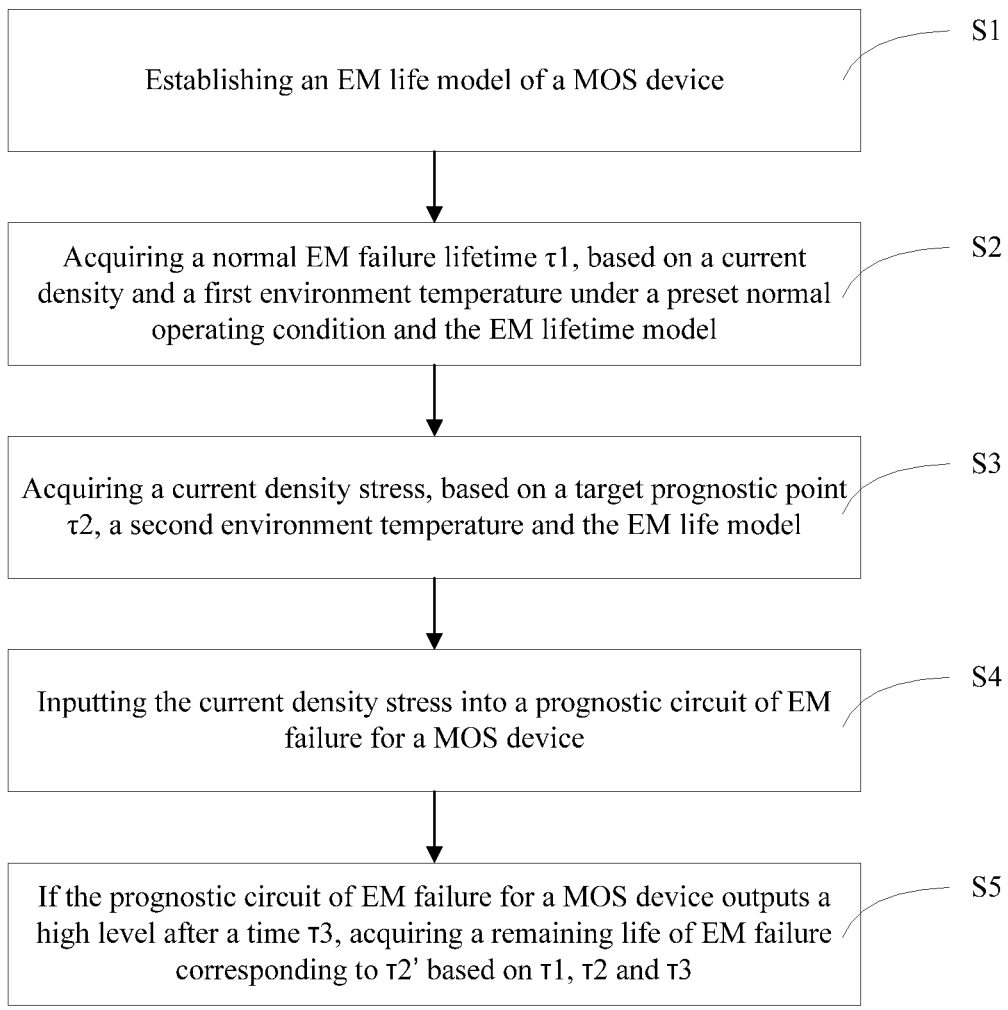
FIG. 1 is a flowchart illustrating a method for predicting remaining life of EM failure according to one embodiment of the present disclosure.

The present disclosure provides a method for predicting remaining life of EM failure, as shown in FIG. 1, includes the following steps:

S1, establishing an EM life model of a MOS device;

S2, acquiring a normal EM failure lifetime $\tau_1$, based on a current density and a first environment temperature under a preset normal operating condition and the EM lifetime model;

S3, acquiring a current density stress, based on a target prognostic point $\tau_2$, a second environment temperature and the EM life model;

S4, inputting the current density stress into a prognostic circuit of EM failure for a MOS device;

S5, if the prognostic circuit of EM failure for a MOS device outputs a high level after a time $\tau_3$, acquiring a remaining life of EM failure corresponding to $\tau_2'$ based on $\tau_1$, $\tau_2$ and $\tau_3$.

The present disclosure starts with the current active state of the MOS device to predicate the EM failure in the MOS device that may appear in the future combined with the actual working state and working environment of the device, especially before the failure, evaluates the remaining life of the device in order to replace the MOS device near failure before the occurrence of fault, to ensure reliability. The present disclosure needs no periodic test to learn the remaining life before EM failure, which can reduce the cost caused by periodic tests and improve testing efficiency.

Specifically, the present disclosure includes the following steps:

Step 1, establishing an EM life model of a MOS device.

In the embodiment, the life model that accelerates EM failure can be expressed by as Black equation as $$\tau = AJ^{-n} \exp\left(\frac{E_a}{kT}\right), \quad (1)$$

Where $\tau$ is a failure time, A is a coefficient that is dependent on metal layer features, J is a current density, n is a current density factor, $E_a$ is activation energy, k is a boltzmann constant, which is $1.38 \times 10^{-23}$ J/K, and T is an environment temperature.

Step 2, obtaining an EM life model of a MOS device with determined parameters.

The EM life model under operating condition can be obtained according to the formula (1), as $$\tau_{op} = \tau_{MTTF}\left(\frac{J_{use}}{J_{test}}\right) \exp\left[\frac{E_a}{k}\left(\frac{1}{T_{use}} - \frac{1}{T_{test}}\right)\right], \quad (2)$$

Where $\tau_{op}$ is a lifetime of EM failure of the MOS device under operating condition, $\tau_{MTTF}$ is a median lifetime under acceleration test condition, $J_{use}$ is a current density under operating condition, $J_{test}$ is a current density under acceleration test condition, $T_{use}$ is an environment temperature under operating condition, and $T_{test}$ is an environment temperature under acceleration test condition.

The undetermined parameters $\tau_{MTTF}$, $J_{test}$, n, $E_a$ and $T_{test}$ can be obtained by experiments or use the prior data directly. In the embodiment, the prior data is directly used, which includes $2.203 \times 10^3$ s, $1.531 \times 10^7$ A/cm$^2$, $0.788 \times 1.602 \times 10^{-19}$ J and 573 K, so the EM life model of the MOS device with determined parameters is obtained as $$\tau_{op} = \\ 2.203 \times 10^3 \left(\frac{J_{use}}{1.531 \times 10^7}\right)^{-2} \exp\left[\frac{0.788 \times 1.602 \times 10^{-19}}{1.38 \times 10^{-23}}\left(\frac{1}{T_{use}} - \frac{1}{573}\right)\right]. \quad (3)$$

Step 3, designing a prognostic circuit of EM failure for a MOS device.

Figure 2:
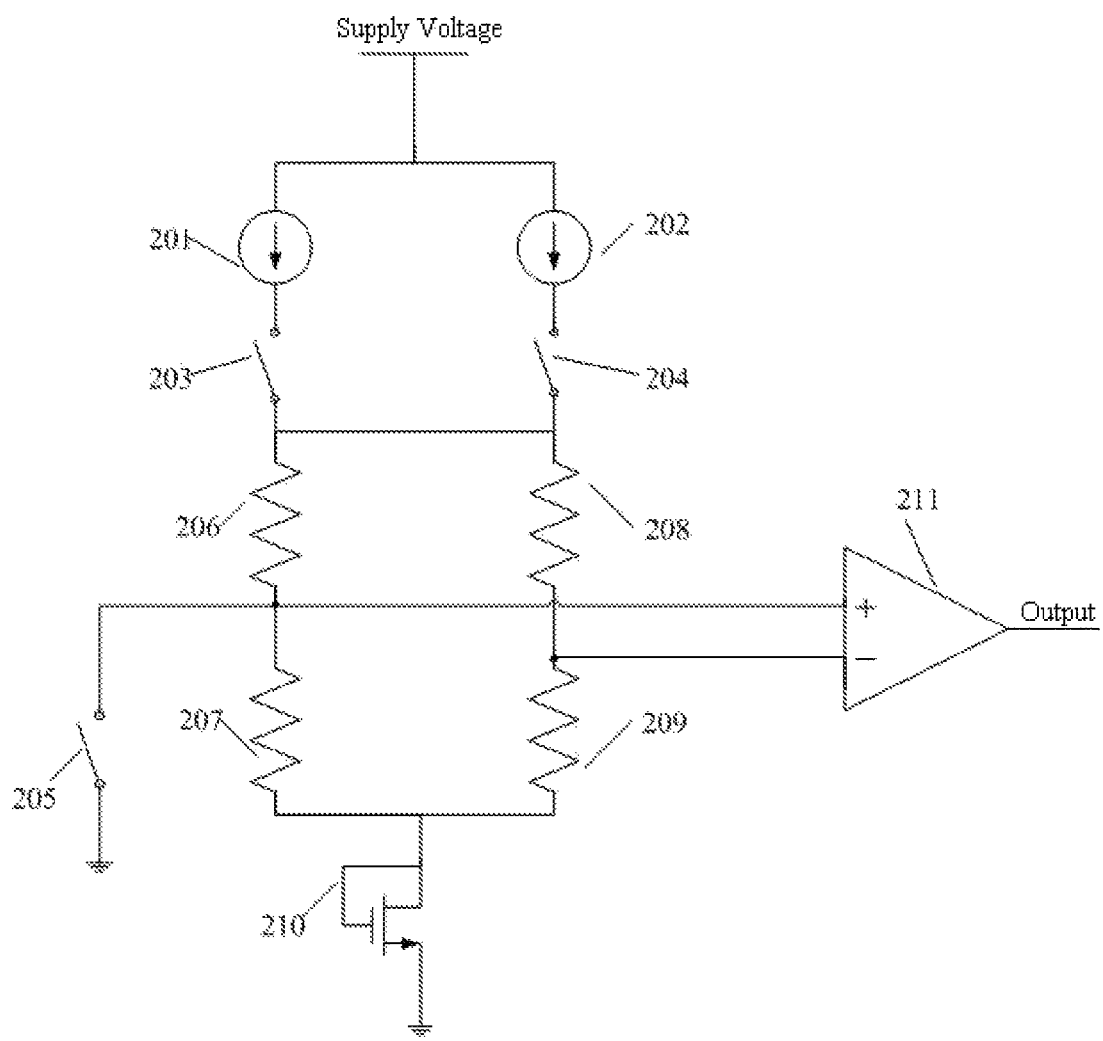
FIG. 2 is a schematic diagram illustrating a prognostic circuit of EM failure for a MOS device according to one embodiment of the present disclosure.

The prognostic circuit of EM failure for a MOS device is a warning circuit that becomes failure due to resistance variation caused by EM, as shown in FIG. 2. It includes a MOS device 210, two metal interconnect resistances 206 and 207 with the same resistance, and two polysilicon resistors 208 and 209 wherein the ratio of the resistance of the polysilicon resistor 208 to that of the polysilicon resistor 209 is 1.2. During a stress current phase, the switches 203 and 205 are closed, the switch 204 is open, and the stress current 201 flows through the metal interconnect resistance 206, to cause EM. During a test current phase, the switch 204 is closed, the switches 203 and 205 are open, and the test current 202 flows through two branches. If there is no EM, the resistance variation of the metal interconnect resistance 206 is less than 20%, and it can be learn from the relationship of voltage division in the two branches that the output of the comparer 211 is at the low level as "0". If there is an EM, the resistance variation of the metal interconnect resistance 206 is larger than 20%, and it can be learn from the relationship of voltage division in the two branches that the output of the comparer 211 is at the high level as "1".

Step 4, acquiring a normal EM failure lifetime $\tau_1$, based on a current density and a first environment temperature under a preset normal operating condition.

Put the current density and the first environment temperature under the preset normal operating condition into the above formula (3), and obtain the normal EM failure lifetime $\tau_1$.

For example, under the preset normal operating condition, the current density J1 and the first environment temperature which are $8 \times 10^5$ A/cm$^2$ and 400 K are put into the formula (3), and the normal EM failure lifetime of the MOS device under operating condition can be obtained as $8 \times 10^8$ s.

Step 5, acquiring a current density stress based on a target prognostic point $\tau_2$ and a second environment temperature.

Put the target prognostic point $\tau_2$ and the second environment temperature into the above formula (3), and acquire the current density stress.

For example, the target prognostic point $\tau_2$ and the second environment temperature which are $6.4 \times 10^8$ s and 400 K are put into the formula (3) to calculate the current density stress. Then put the current density stress as stress current 201 in FIG. 2.

Step 6, if the prognostic circuit of EM failure for a MOS device outputs a high level after a time $\tau_3$, acquiring a remaining life of EM failure corresponding to $\tau_2'$ based on $\tau_1$, $\tau_2$ and $\tau_3$.

Assume the prognostic circuit of EM failure for a MOS device outputs a high level in the time $\tau_3 = 6.4 \times 10^8$ s that a warning signal is sent, the remaining life of the EM failure corresponding to the target prognostic point $\tau_2'$ can be acquired by $$\tau_2' = \left(\frac{\tau_1}{\tau_2} - 1\right)\tau_3$$

Where $\tau_2'$ corresponds to the remaining life of the EM failure. Take the data in Step 4 and Step 5 for example, and we can get $$\tau_2'=(8\times10^8/6.4\times10^8-1)*6.4\times10^8 \ s = 1.6\times10^8 \ s. \quad 5$$

In order to predicate different EM remaining lifetime, different current density stress can be designed that a plurality of target prognostic points and environment temperatures can be set, and using the above steps from 1 to 6, the remaining life of the EM failure corresponding to the different target prognostic point can be acquired.

Figure 3:
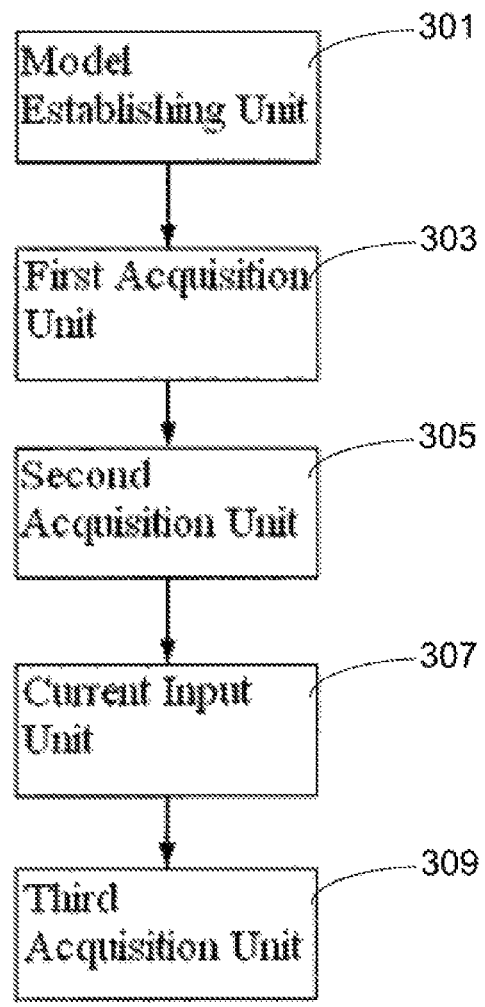
FIG. 3 is a schematic diagram illustrating a device for remaining life prediction for EM failure according to one embodiment of the present disclosure.

The present disclosure also provides a device for remaining life prediction for EM failure, as shown in FIG. 3, includes a number of computing units, to be described hereinafter. Each such unit is understood to be a distinct process, processor module, or code module, residing on one or more computing devices. The units illustrated in FIG. 3 include:

a model establishing unit 301, configured to establish an EM life model of a MOS device;

a first acquisition unit 303, configured to acquire a normal EM failure lifetime $\tau_1$, based on a current density and a first environment temperature under a preset normal operating condition and the EM life model;

a second acquisition unit 305, configured to acquire a current density stress, based on a target prognostic point $\tau_2$, a second environment temperature and the EM life model;

a current input unit 307, configured to input the current density stress into a prognostic circuit of EM failure for a MOS device; and a third acquisition unit 309, configured to if the prognostic circuit of EM failure for a MOS device outputs a high level after a time $\tau_3$, acquire a remaining life of EM failure corresponding to $\tau_2'$ based on $\tau_1$, $\tau_2$ and $\tau_3$.

The present disclosure starts with the current active state of the MOS device to predicate the EM failure in the MOS device that may appear in the future combined with the actual working state and working environment of the device, especially before the failure, evaluates the remaining life of the device in order to replace the MOS device near failure before the occurrence of fault, to ensure reliability. The present disclosure needs no periodic test to learn the remaining life before EM failure, which can reduce the cost caused by periodic tests and improve testing efficiency.

Specifically, the first acquisition unit is configured to acquire an EM life model of a MOS device under operating condition based on the EM life model of the MOS device.

Obtain an EM life model of a MOS device with determined parameters, based on the EM life model of the MOS device under operating condition:

$$\tau_{op} = 2.203\times 10^3 \left(\frac{J_{use}}{1.531\times 10^7}\right)^{-2} \exp\left[\frac{0.788\times 1.602\times 10^{-19}}{1.38\times 10^{-23}}\left(\frac{1}{T_{use}}-\frac{1}{573}\right)\right],$$

where $\tau_{op}$ is a lifetime of EM failure of the MOS device under operating condition, $J_{use}$ is a current density under operating condition, and $T_{use}$ is an environment temperature under operating condition.

Acquire a normal EM failure lifetime $\tau_1$ based on a current density and a first environment temperature under a preset normal operating condition.

Specifically, the second acquisition unit is configured to acquire a current density stress based on a target prognostic point $\tau_2$ and a second environment temperature.

The third acquisition unit is configured to acquire a remaining life of EM failure corresponding to the target prognostic point by $$\tau 2' = \left(\frac{\tau 1}{\tau 2}-1\right)\tau 3$$

where $\tau_2'$ is the remaining life of EM failure corresponding to the target prognostic point.

In conclusion, the present disclosure has advantages as follows:

From an economic point of view, the present disclosure is the main technical path for reducing the reliability support cost of MOS devices. The maintenance support cost can be reduced by reducing support resource requirements, such as backup unit, reliability device and manpower for periodic test; the availability rate can be improved by reducing periodic tests, especially, unplanned tests; and the risk caused by a fault of a MOS device during the implementation procedure can be reduced by health perception, to improve the success rate.

From a technical point of view, the present disclosure starts with the current active state of the MOS device to predicate the EM failure in the device that may appear in the future, in order to replace the MOS device near failure before the occurrence of fault, to ensure reliability. In addition to reduce or avoid a major accident in use of the MOS device, the cost caused by periodic tests can be reduced, to improve testing effective. The accident caused by the insufficient of reliability can also be prevented. Especially before the failure, plenty of time between failures can be guaranteed by evaluating the remaining life of the device in order to replace the MOS device near failure before the occurrence of fault.

The embodiments are chosen and described in order to explain the principles of the disclosure and their practical application so as to activate others skilled in the art to utilize the disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A device for remaining life prediction for EM failure, the device comprising a processor configured to:
    establish an electromigration (EM) life model of a metal oxide semiconductor (MOS) device;
    acquire a normal EM failure lifetime $\tau_1$, based on a current density and a first environment temperature under a preset normal operating condition and the EM life model;
    acquire a current density stress, based on a target prognostic point $\tau_2$, a second environment temperature and the EM life model;
    input the current density stress into a prognostic circuit of EM failure for the MOS device, wherein the prognostic circuit of EM failure for the MOS device is a warning circuit that becomes failure due to resistance variation caused by EM;

if the prognostic circuit of EM failure for the MOS device outputs a binary high level after a time $\tau_3$, acquire a remaining life of EM failure corresponding to $\tau_2'$ based on $\tau_1$, $\tau_2$ and $\tau_3$; and acquire a remaining life of EM failure corresponding to the target prognostic point by $$\tau 2' = \left(\frac{\tau 1}{\tau 2} - 1\right)\tau 3,$$

where $\tau_2'$ is the remaining life of EM failure corresponding to the target prognostic point.

2. The device for remaining life prediction for EM failure of claim 1, wherein the processor is further configured to acquire a first EM life model of the MOS device under operating condition based on the EM life model of the MOS device, obtain a second EM life model of the MOS device with determined parameters, based on the first EM life model of the MOS device under operating condition:

$$\tau_{op} = 2.203 \times 10^3 \left(\frac{J_{use}}{1.531 \times 10^7}\right)^{-2} \exp\left[\frac{0.788 \times 1.602 \times 10^{-19}}{1.38 \times 10^{-23}}\left(\frac{1}{T_{use}} - \frac{1}{573}\right)\right],$$

where $\tau_{op}$ is a lifetime of EM failure of the MOS device under operating condition, $J_{use}$ is a current density under operating condition, and $T_{use}$ is an environment temperature under operating condition, and acquire a normal EM failure life $\tau_1$ based on the current density and a first environment temperature under a preset normal operating condition.

3. The device for remaining life prediction for EM failure of claim 2, wherein the processor is further configured to acquire a current density stress based on a target prognostic point $\tau_2$, a second environment temperature and the second updated EM life model of the MOS device with determined parameters.

4. The device for remaining life prediction for EM failure of claim 1, wherein the processor is further configured to acquire a remaining life of EM failure corresponding to the target prognostic point by $$\tau 2' = \left(\frac{\tau 1}{\tau 2} - 1\right)\tau 3,$$

where $\tau_2'$ is the remaining life of EM failure corresponding to the target prognostic point.

* * * * *